United States Patent

Gong et al.

(10) Patent No.: US 9,355,710 B2
(45) Date of Patent: May 31, 2016

(54) HYBRID APPROACH TO WRITE ASSIST FOR MEMORY ARRAY

(71) Applicant: Nvidia Corporation, Santa Clara, CA (US)

(72) Inventors: Haiyan Gong, Santa Clara, CA (US);
Lei Wang, Santa Clara, CA (US);
Sing-Rong Li, Santa Clara, CA (US);
Hwong-Kwo Lin, Santa Clara, CA (US);
Pai-Yi Chang, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 158 days.

(21) Appl. No.: 14/162,639

(22) Filed: Jan. 23, 2014

(65) Prior Publication Data

US 2015/0206577 A1    Jul. 23, 2015

(51) Int. Cl.
 G11C 11/412    (2006.01)
 G11C 11/419    (2006.01)
 G11C 5/14      (2006.01)

(52) U.S. Cl.
 CPC ............... G11C 11/419 (2013.01); G11C 5/147 (2013.01)

(58) Field of Classification Search
 USPC .......................................... 365/149, 102, 154
 See application file for complete search history.

(56) References Cited

U.S. PATENT DOCUMENTS

| 2008/0112212 A1* | 5/2008 | Wang et al. ................... 365/154 |
| 2008/0158939 A1* | 7/2008 | Chen et al. .................... 365/154 |
| 2010/0182865 A1* | 7/2010 | Wu ................................ 365/226 |

* cited by examiner

Primary Examiner — Hoai V Ho
Assistant Examiner — Minh Dinh

(57) ABSTRACT

A hybrid write-assist memory system includes an array voltage supply and a static random access memory (SRAM) cell that is controlled by bit lines and a word line and employs a separable cell supply voltage coupled to the array voltage supply. Additionally, the hybrid write-assist memory system includes a supply voltage droop unit that is coupled to the SRAM cell and provides a voltage reduction of the separable cell supply voltage during a write operation. Also, the hybrid write-assist memory system includes a negative bit line unit that is coupled to the supply voltage droop unit and provides a negative bit line voltage concurrently with the voltage reduction of the separable cell supply voltage during the write operation. A method of operating a hybrid write-assist memory system is also provided.

18 Claims, 5 Drawing Sheets

HYBRID APPROACH TO WRITE ASSIST FOR MEMORY ARRAY

TECHNICAL FIELD

This application is directed, in general, to a computer memory and, more specifically, to a hybrid write-assist memory system and a method of operating a hybrid write-assist memory system.

BACKGROUND

As technology advances, SRAM core voltage reduction has lagged behind logic voltage, and has become a limiting bottleneck for semiconductor chip power consumption improvement. The main limiting factor is that the minimum voltage (Vmin) of an SRAM write voltage cannot be scaled down aggressively due to increased threshold voltage variations and increased SRAM capacity requirements as the device size decreases. To resolve this issue, write assist circuits have become a main focus of interest to allow further reduction of the minimum voltage (Vmin) without write failure. Write failure usually occurs when a pass gate transistor cannot overpower a corresponding pull up transistor in an SRAM cell. Improvements in this area would be beneficial to the art.

SUMMARY

Embodiments of the present disclosure provide a hybrid write-assist memory system and a method of operating a hybrid write-assist memory system.

In one embodiment, the hybrid write-assist memory system includes an array voltage supply and a static random access memory (SRAM) cell that is controlled by bit lines and a word line and employs a separable cell supply voltage coupled to the array voltage supply. Additionally, the hybrid write-assist memory system includes a supply voltage droop unit that is coupled to the SRAM cell and provides a voltage reduction of the separable cell supply voltage during a write operation. Also, the hybrid write-assist memory system includes a negative bit line unit that is coupled to the supply voltage droop unit and provides a negative bit line voltage concurrently with the voltage reduction of the separable cell supply voltage during the write operation.

In another aspect, the method of operating a hybrid write-assist memory system includes providing an array supply voltage and additionally providing a static random access memory (SRAM) cell that is controlled by bit lines and a word line and employs a separable cell supply voltage coupled to the array supply voltage. The method also includes generating a reduction of the separable cell supply voltage during a write operation and establishing a negative bit line voltage together with the reduction of the separable cell supply voltage during the write operation.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure provide a hybrid write assist approach for memory applications that efficiently employs less layout area, memory power and propagation delay overhead, while concurrently maximizing supply voltage reduction and negative bit line benefits. Design complexity is reduced for compiler memory, which can speed up product readiness. The write assist approach also improves SRAM yields, thus reducing fabrication costs.

Figure 1:
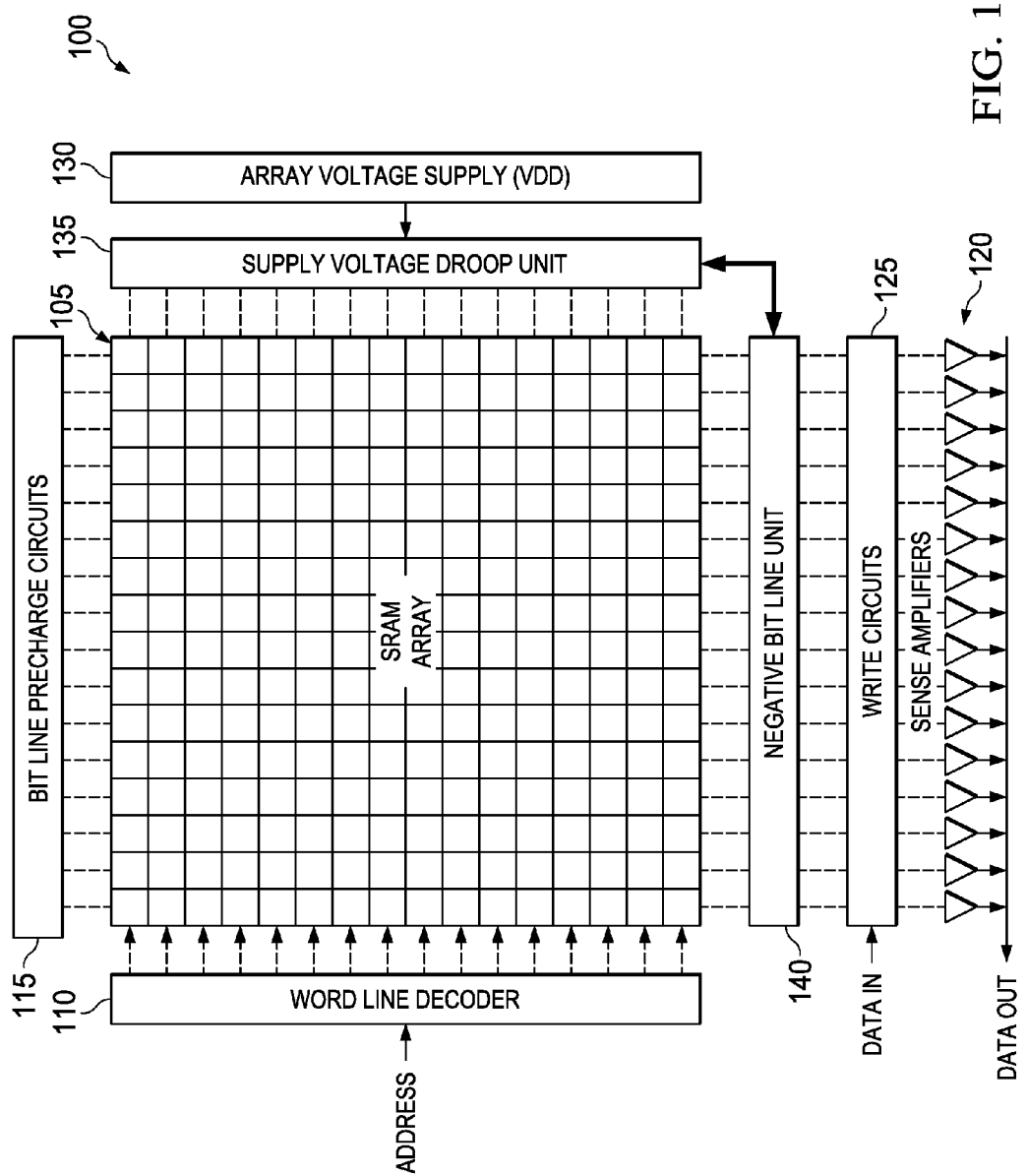
FIG. 1 illustrates a diagram of an SRAM memory that includes a hybrid write-assist memory system constructed according to the principles of the present disclosure.

FIG. 1 illustrates a diagram of an SRAM memory, generally designated 100, that includes a hybrid write-assist memory system constructed according to the principles of the present disclosure. The SRAM memory 100 includes an SRAM array 105, a word line decoder 110, bit line precharge circuits 115, sense amplifiers 120, write circuits 125, an array voltage supply 130, a supply voltage droop unit 135 and a negative bit line unit 140.

The SRAM array 105 includes a group of SRAM cells wherein each SRAM cell stores one bit of data. The group of SRAM cells is arranged horizontally into rows corresponding to a number of bits per word of the SRAM memory 100 and vertically corresponding to a total number of words contained in the SRAM memory 100.

The word line decoder 110 determines which word of the total number of words is to be addressed and enables a word line of that row of bits for further action (e.g., reading from or writing into that particular word). In this particular embodiment, each SRAM cell employs two bit lines (i.e., a bit line pair per array column). All of the bit line pairs are precharged to a TRUE condition by the precharge bit line circuits 115 before the word line is enabled to facilitate reading from or writing to the word row after the word line is enabled.

The sense amplifiers support reading a data storage condition of each SRAM cell in the selected word line to provide data output from the SRAM memory 100. Correspondingly, the write circuits 125 support writing of input data into the selected word line to provide data input to the SRAM memory 100. In this embodiment, the array voltage supply 130 provides a supply voltage VDD not only to the SRAM array 105, but to the SRAM memory 100, in general.

Additionally, the supply voltage droop unit 135 is coupled to each SRAM cell in the selected word line of the SRAM array 105 and provides a voltage reduction of the separable cell supply voltage during a write operation. The negative bit line unit 140 is coupled to the supply voltage droop unit 135 and provides a negative bit line voltage concurrently with the voltage reduction of the separable cell supply voltage during the write operation.

Figure 2:
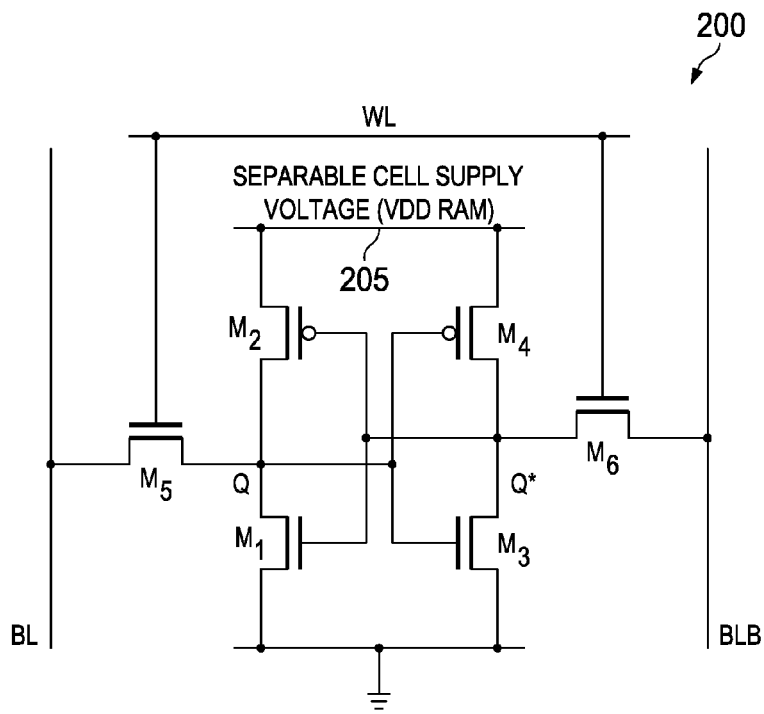
FIG. 2 illustrates a diagram of an SRAM cell as may be employed in the SRAM array 105 of FIG. 1.

FIG. 2 illustrates a diagram of an SRAM cell, generally designated 200, as may be employed in the SRAM array 105 of FIG. 1. The SRAM cell 200 includes a pair of cross-coupled CMOS inverters M1:M2 and M3:M4 that provide a memory cell having storage nodes Q and Q* that are complementary, as shown. The SRAM cell 200 also includes corresponding first and second pass gate transistors M5 and M6 that are respectively connected between a bit line BL and the storage node Q and a complementary bit line BLB and the complementary storage node Q*. The first and second pass gate transistors M5 and M6 are controlled by a word line WL, and the cross-coupled CMOS inverters M1:M2 and M3:M4 are powered by a separable cell supply voltage (VDD RAM) 205.

In the illustrated embodiment, the separable cell supply voltage VDD RAM is reduced by an amount that ranges from 20 to 30 percent of its initial voltage, which is equal to an array supply voltage (VDD) (as shown in FIG. 1). This voltage reduction occurs during a write operation when the word line WL is activated. Concurrently, the appropriate bit line (BL or BLB) is provided with a negative bit line voltage during the write operation. These two concurrent events facilitate writing into the SRAM cell 200 through lowering (i.e., weakening) of its supply voltage and increasing (i.e., strengthening) a magnitude of the bit line voltage, thereby enhancing the write operation for the SRAM cell 200.

Here, the voltage reduction of the separable cell supply voltage VDD RAM is provided through charge sharing, and the negative bit line voltage is provide through additional charge coupling to provide the negative bit line voltage. This charge sharing and charge coupling employ distributed capacitances that are provided by judicious design and layout of an SRAM array such as the SRAM array 105 of FIG. 1. These distributed capacitances are fringing capacitances in an upper metal layer of the SRAM array or memory, and this write assist approach is scalable with (i.e., adaptable to) SRAM array or memory size.

Figure 3:
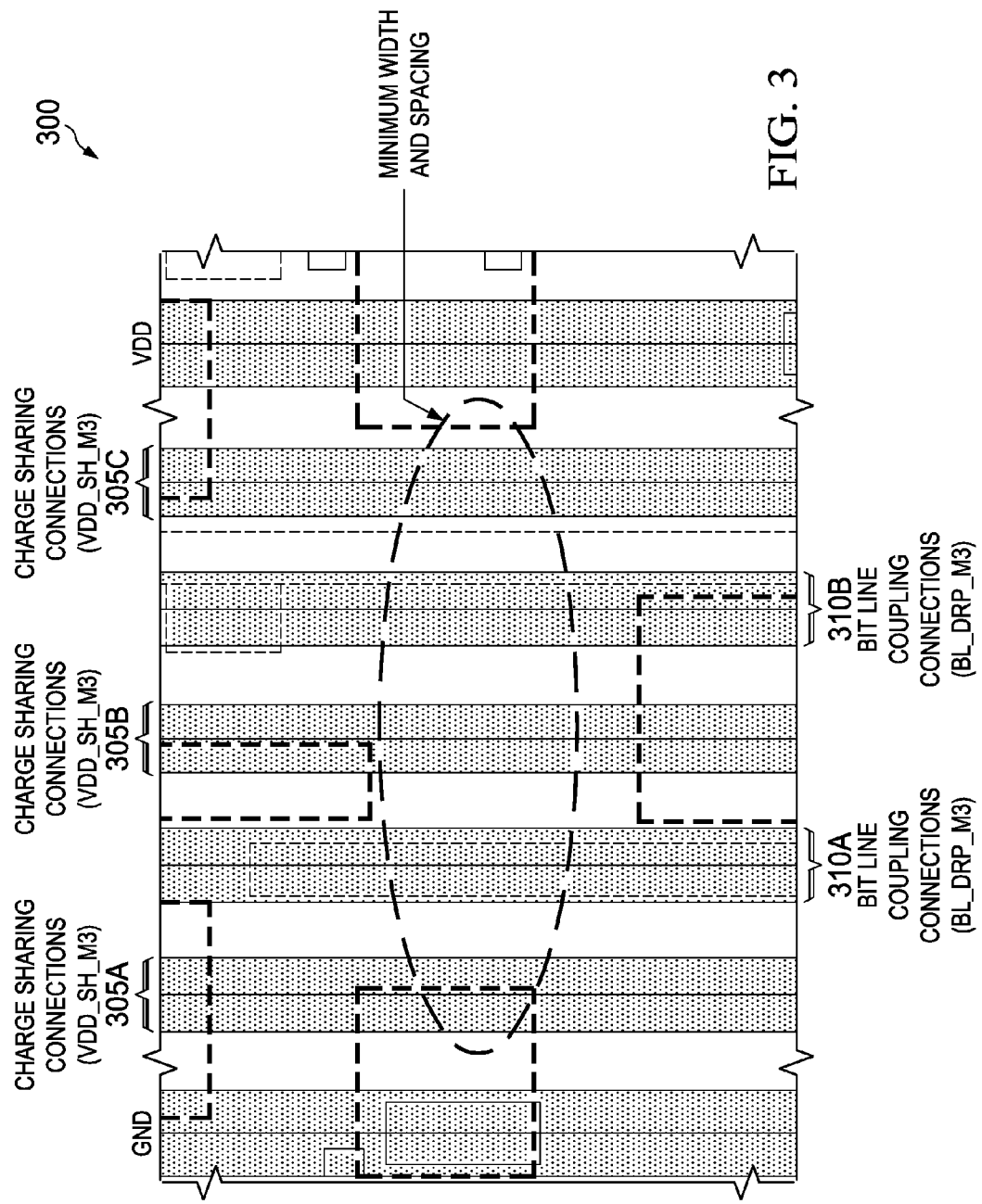
FIG. 3 illustrates a view of an embodiment of an upper metal layer of an SRAM array or memory as may be employed in the memory cell 100 of FIG. 1.

FIG. 3 illustrates a view of an embodiment of an upper metal layer of an SRAM array or memory, generally designated 300, as may be employed in the memory cell 100 of FIG. 1. The upper metal layer 300 includes a charge sharing connection structure 305A, 305B, 305C, a bit line coupling connection structure 310A, 310B and an array supply voltage (VDD) connection and a ground (GND) connection.

As shown, the charge sharing connection structure 305A, 305B, 305C and the bit line coupling connection structure 310A, 310B are interleaved structures that are located between the array supply voltage (VDD) connection and the ground (GND) connection and employ minimum widths and spacing, which enhances the distributed capacitance between them. The charge sharing connection structure 305A, 305B, 305C and the bit line coupling connection structure 310A, 310B are a same height as array bit lines thereby substantially maintaining critical capacitance ratios when array size scaling occurs.

These connection structures additionally employ a plurality of metal wires thereby increasing their fringing capacitance, which is a dominant capacitance when compared to area capacitance, due to technology scaling. Since distributed capacitance is employed in a metal layer above an SRAM array or memory, no additional layout area is needed as would be the case if using local capacitors.

Figure 4:
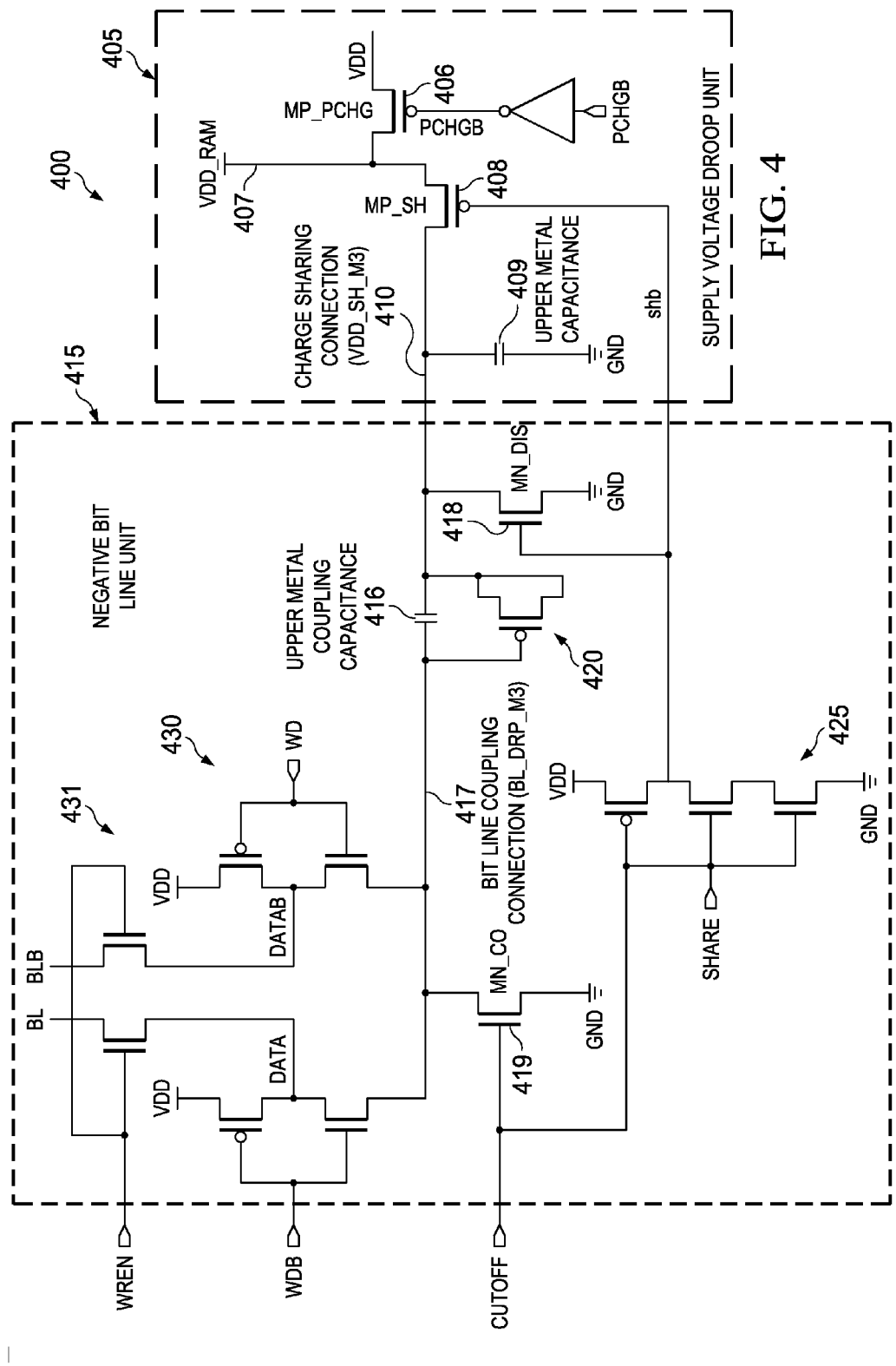
FIG. 4 illustrates a combined schematic diagram showing an embodiment of a supply voltage droop unit and a negative bit line unit constructed according to the principles of the present disclosure.

FIG. 4 illustrates a combined schematic diagram, generally designated 400, showing an embodiment of a supply voltage droop unit 405 and a negative bit line unit 415 constructed according to the principles of the present disclosure.

The supply voltage droop unit 405 includes a separation switch 406 that separates a separable cell supply voltage (VDD RAM) 407 from an array voltage supply (VDD) based on a bit line precharge signal PCHG. Also included is a charge sharing switch 408 that connects the separable cell supply voltage (VDD RAM) 407 through a charge sharing connection 410 to the ungrounded side of an upper metal capacitance 409 during a charge sharing time.

The negative bit line unit 415 includes an upper metal coupling capacitance 416 that is connected to the charge sharing connection 410 and a bit line coupling connection 417. Also included are a share grounding switch 418 that is employed to ground the charge sharing connection 410 and a cutoff grounding switch 419 that is employed to ground the bit line coupling connection 417, at appropriate times.

Additionally included is a sharing control circuit 425 that provides control of the charge sharing switch 408 and the share grounding switch 418. A local compensation capacitor 420 is included and connected in parallel with the upper metal coupling capacitance 416. Further included are write driver (WDB, WD) circuits 430 and write enable (WREN) circuits 431 that support control of bit lines BL and BLB.

Figure 5:
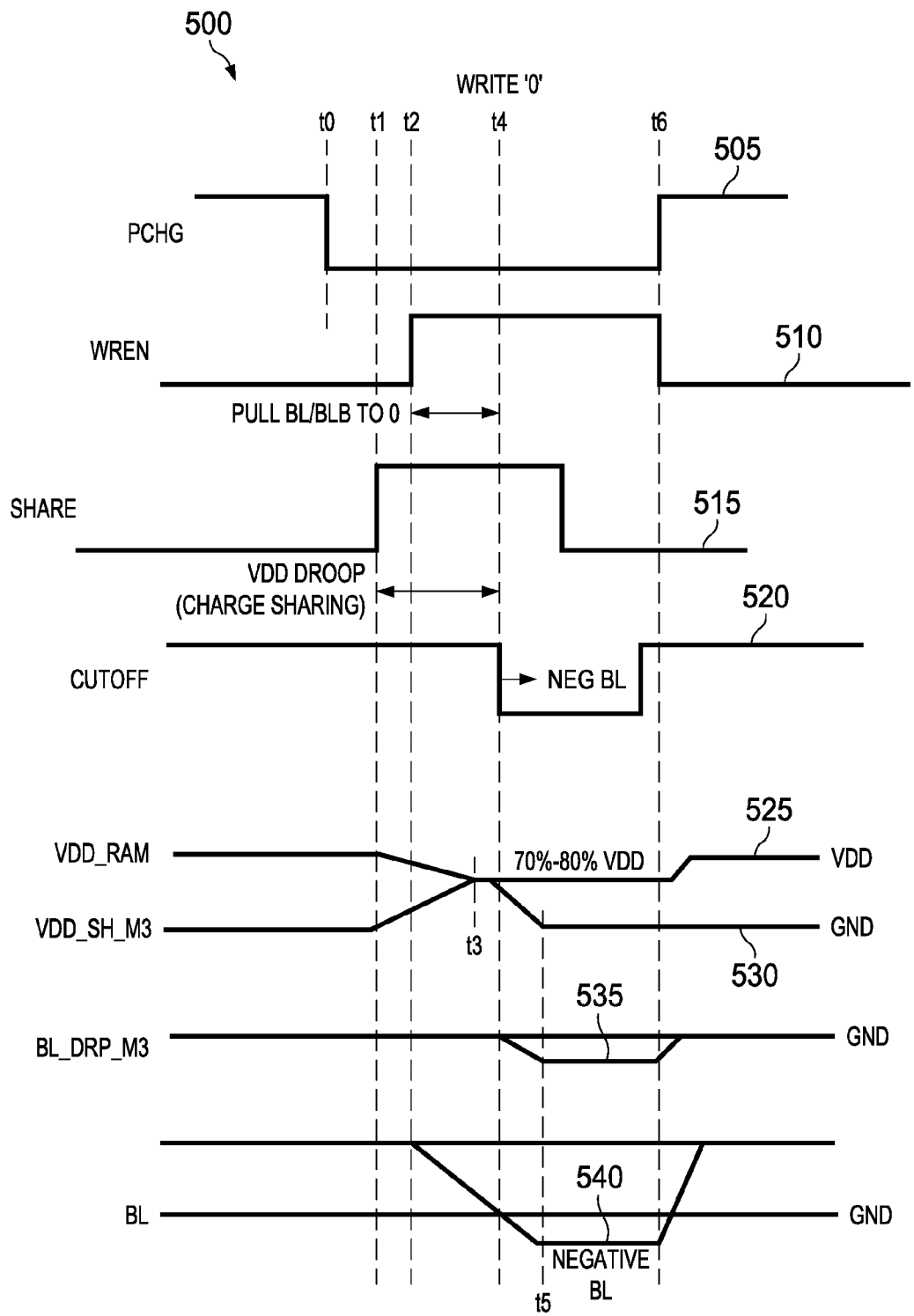
FIG. 5 illustrates a timing diagram corresponding to the combined schematic diagram of FIG. 4.

FIG. 5 illustrates a timing diagram, generally designated 500, corresponding to the combined schematic diagram 400 of FIG. 4. The timing diagram 500 includes waveforms that demonstrate a write assist providing a voltage reduction of a separable cell supply voltage concurrently with a negative bit line voltage based on embodiments and principles of the present disclosure.

The timing diagram 500 illustrates waveforms and timing of four salient bit line control signals for a write operation that include a bit line precharge waveform (PCHG) 505, a write enable waveform (WREN) 510, a charge sharing control waveform (SHARE) 515 and a sharing cutoff control waveform (CUTOFF) 520. The timing diagram 500 also illustrates waveforms and timing of four resulting signals that include a separable cell supply voltage waveform (VDD_RAM) 525, a charge sharing connection voltage waveform (VDD_SH_M3) 530, a negative bit line voltage that exists on a bit line coupling connection waveform (BL_DRP_M3) 535 and a bit line BL voltage waveform 540 coupled to a bit line (BL) showing the negative bit line voltage that is coupled to the bit line (BL).

The PGHG waveform 505 indicates that the write operation occurs when the PCHG control signal is not activated between timing events t0-t6. During this time period, the separation switch 406 (of FIG. 4) is not activated thereby separating the separable cell supply voltage (VDD RAM) 407 from the array voltage supply (VDD).

At timing event t1, the control signal SHARE 510 is activated thereby activating the charge sharing switch 408 and deactivating the share grounding switch 418. The control signal CUTOFF 520 is also active thereby activating the cutoff grounding switch 419.

These timing event t1 actions connect the uncharged upper metal capacitance 409 and the upper metal coupling capacitance 416 in parallel through the charge sharing connection (VDD_SH_M3) 410 to the separable cell supply voltage (VDD RAM) 407, which begins to discharge from an initial value of VDD as it shares charge and as shown by the separable cell supply voltage waveform (VDD_RAM) 525. The charge sharing connection voltage waveform (VDD_SH_M3) 530 indicates the charging of the parallel connected upper metal capacitance 409 and upper metal coupling capacitance 416 as they reach an equilibrium voltage of about 70 percent to 80 percent of VDD at timing event t3, in this example.

At timing event t2, the control signal WREN 510 is activated thereby causing the bit line BL to begin discharging from its precharged voltage level to a ground (GND) level as shown in the bit line (BL) voltage waveform 540.

At timing event t4, the bit line BL has reached ground level, and the CUTOFF control signal 520 is deactivated. This action deactivates the charge sharing switch 408 and the cutoff grounding switch 419, which leaves the charge sharing connection 410 floating at about 70 percent to 80 percent of VDD and the bit line coupling connection 417 floating at zero volts. Deactivating the CUTOFF control signal 520 also activates the share grounding switch 418 causing the charge sharing connection 410 to approach ground (GND) level as shown in the charge sharing connection voltage waveform (VDD_SH_M3) 530.

This action drives the bit line coupling connection 417 negative due to the charge on the upper metal coupling capacitance 416 as shown by the bit line coupling connection waveform (BL_DRP_M3) 535. This negative condition is conveyed to the bit line BL (in this example) by the write driver (WDB, WD) circuits 430 and write enable (WREN) circuits 431 as seen in the bit line voltage waveform 540 starting at timing event t5. At timing event t6, the write operation is complete and all of the waveforms of FIG. 5 return to their starting conditions, as shown.

Figure 6:
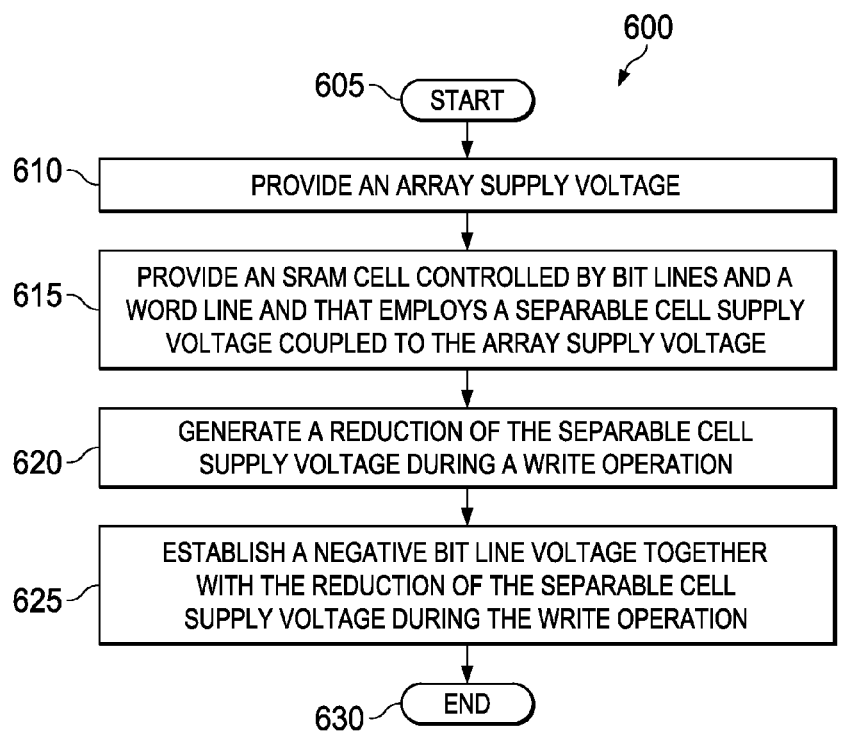
FIG. 6 illustrates a flow diagram of an embodiment of a method of operating a hybrid write-assist memory system carried out according to the principles of the present disclosure.

FIG. 6 illustrates a flow diagram of an embodiment of a method of operating a hybrid write-assist memory system, generally designated 600, carried out according to the principles of the present disclosure. The method 600 starts in a step 605, and in a step 610, an array supply voltage is provided. Then, in a step 615, a static random access memory (SRAM) cell controlled by bit lines and a word line is provided that employs a separable cell supply voltage coupled to the array supply voltage. A reduction of the separable cell supply voltage is generated during a write operation, in a step 620, and a negative bit line voltage is established together with the reduction of the separable cell supply voltage during the write operation, in a step 625.

In one embodiment, the separable cell supply voltage is equal to the array supply voltage before and after the write operation. In another embodiment, a first control signal initiates the voltage reduction of the separable cell supply voltage and a second control signal initiates the negative bit line voltage.

In yet another embodiment, the voltage reduction of the separable cell supply voltage is provided through a charge sharing with an upper metal capacitance and an upper metal coupling capacitance during an initial portion of the write operation. Correspondingly, the upper metal capacitance and the upper metal coupling capacitance are fringing capacitances. In still another embodiment a shared charge on the upper metal coupling capacitance is further coupled to one of the bit lines to provide the negative bit line voltage during a remaining portion of the write operation. Additionally, a local compensation capacitor is provided in parallel with the upper metal coupling capacitance to maintain a constant array bit line capacitance ratio.

In a further embodiment, the upper metal capacitance and the upper metal coupling capacitance are provided by respective first and second upper metal structures having a plurality of metal wires that are constructed in parallel with array bit lines and array supply voltage lines. Correspondingly, the first and second upper metal structures are interleaved structures.

Additionally, the first and second upper metal structures are a same height as array bit lines. The method 600 ends in a step 630.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A hybrid write-assist memory system, comprising:
an array voltage supply;
a static random access memory (SRAM) cell that is controlled by bit lines and a word line and employs a separable cell supply voltage coupled to the array voltage supply;
a supply voltage droop unit that is coupled to the SRAM cell and provides a voltage reduction of the separable cell supply voltage during a write operation, wherein the voltage reduction of the separable cell supply voltage is provided through a charge sharing connection with an upper metal capacitance and an upper metal coupling capacitance during an initial portion of the write operation; and
a negative bit line unit that is coupled to the supply voltage droop unit and provides a negative bit line voltage concurrently with the voltage reduction of the separable cell supply voltage during the write operation.

2. The system as recited in claim 1 wherein the separable cell supply voltage is coupled to the array voltage supply before and after the write operation.

3. The system as recited in claim 1 wherein a first control signal initiates the voltage reduction of the separable cell supply voltage and a second control signal initiates the negative bit line voltage.

4. The system as recited in claim 1 wherein the upper metal capacitance and the upper metal coupling capacitance are fringing capacitances.

5. The system as recited in claim 1 wherein a shared charge on the upper metal coupling capacitance is further coupled to one of the bit lines through a bit line coupling connection to provide the negative bit line voltage during a remaining portion of the write operation.

6. The system as recited in claim 1 wherein a local compensation capacitor is provided in parallel with the upper metal coupling capacitance to maintain a constant array bit line capacitance ratio.

7. The system as recited in claim 1 wherein the upper metal capacitance and the upper metal coupling capacitance are provided by respective first and second upper metal structures having a plurality of metal wires that are constructed in parallel with array bit lines and array voltage supply lines.

8. The system as recited in claim 7 wherein the first and second upper metal structures are interleaved structures.

9. The system as recited in claim 7 wherein the first and second upper metal structures are a same height as array bit lines.

10. A method of operating a hybrid write-assist memory system, comprising:
providing an array supply voltage;

providing a static random access memory (SRAM) cell controlled by bit lines and a word line and that employs a separable cell supply voltage coupled to the array supply voltage;

generating a reduction of the separable cell supply voltage during a write operation, wherein the voltage reduction of the separable cell supply voltage is provided through a charge sharing with an upper metal capacitance and an upper metal coupling capacitance during an initial portion of the write operation; and establishing a negative bit line voltage together with the reduction of the separable cell supply voltage during the write operation.

11. The method as recited in claim 10 wherein the separable cell supply voltage is equal to the array supply voltage before and after the write operation.

12. The method as recited in claim 10 wherein a first control signal initiates the voltage reduction of the separable cell supply voltage and a second control signal initiates the negative bit line voltage.

13. The method as recited in claim 10 wherein the upper metal capacitance and the upper metal coupling capacitance are fringing capacitances.

14. The method as recited in claim 10 wherein a shared charge on the upper metal coupling capacitance is further coupled to one of the bit lines to provide the negative bit line voltage during a remaining portion of the write operation.

15. The method as recited in claim 10 wherein a local compensation capacitor is provided in parallel with the upper metal coupling capacitance to maintain a constant array bit line capacitance ratio.

16. The method as recited in claim 10 wherein the upper metal capacitance and the upper metal coupling capacitance are provided by respective first and second upper metal structures having a plurality of metal wires that are constructed in parallel with array bit lines and array supply voltage lines.

17. The method as recited in claim 16 wherein the first and second upper metal structures are interleaved structures.

18. The method as recited in claim 16 wherein the first and second upper metal structures are a same height as array bit lines.

* * * * *